United States Patent [19]

Niyada et al.

[11] 4,367,441
[45] Jan. 4, 1983

[54] METHOD AND CIRCUIT ARRANGEMENT FOR SHAPING A SIGNAL WAVEFORM

[75] Inventors: Katsuyuki Niyada, Sagamihara; Shoji Hiraoka, Kawasaki; Shuji Morii, Tokyo, all of Japan

[73] Assignee: Matsushita Electric Industrial Company, Limited, Osaka, Japan

[21] Appl. No.: 206,826

[22] Filed: Nov. 14, 1980

[30] Foreign Application Priority Data

Nov. 16, 1979 [JP] Japan ................. 54-149387

[51] Int. Cl.³ .................................. H03K 5/08
[52] U.S. Cl. .................... 328/162; 307/359; 307/555; 328/164; 340/146.3 AC
[58] Field of Search ........... 307/354, 359, 494, 542, 307/546–548, 555, 573; 328/162–165; 340/146.3 AC, 146.3 AE, 146.3 AG; 358/34, 36, 171

[56] References Cited

U.S. PATENT DOCUMENTS 3,504,289 3/1970 Pfeiffer et al. .............. 328/164
3,714,591 1/1973 Allington .................... 328/162
3,772,604 11/1973 Hogg et al. .................. 328/162
4,237,424 12/1980 Weiner ....................... 328/165

Primary Examiner—John Zazworsky
Attorney, Agent, or Firm—Lowe, King, Price & Becker

[57] ABSTRACT

An input signal is applied to a clamping circuit where the level of the input signal is clamped at a desired base line voltage in response to a clamping control signal. The clamping control signal is a pulse train signal, and pulses are applied to the clamping circuit only when the level of the output signal of the clamping circuit is within a given range. Therefore, when the level rising rate or speed is low, the level of the input signal is intermittently clamped so that the output signal level is maintained close to the base line voltage. When the level rising rate exceeds a given value, clamping is not performed so that the output level follows the input level. In order to see whether the level of the output signal is within the given range or not, a reference voltage which is higher than the base line voltage is used when shaping a two-level signal. If the input signal is of three-level, another reference voltage, which is lower than the base line voltage, is additionally used.

9 Claims, 12 Drawing Figures

METHOD AND CIRCUIT ARRANGEMENT FOR SHAPING A SIGNAL WAVEFORM

FIELD OF THE INVENTION

This invention generally relates to a method and circuit arrangement for shaping a signal waveform, and more particularly, the present invention relates to a method and circuit arrangement for shaping an analog signal, such as an output signal of a sensor, into a two-level or three-level signal, or for shaping a digital signal whose waveform has been deteriorated during transmission, into the original waveform.

BACKGROUND OF THE INVENTION

Generally speaking, a signal, such as an output signal of a sensor or a signal which has been transmitted along a long distance, does not have a constant base line or a zero line. Namely, the average level of the signal varies with time. In other words, such a signal has a low frequency component. In addition, the waveform of such a signal is apt to deteriorate. For these reasons, it is sometimes required to shape the waveform of an incoming signal.

According to a conventional technique, an incoming or input signal is integrated by means of an integrator to produce a variable reference level, and then the level of the input signal is compared with the reference level by means of a comparator. The comparator produces a logic "1" signal when the level of the input signal exceeds the reference level. This conventional technique is suitable for an input signal having less logic "1" components with respect to time, namely an input signal having less signal components, or for an input signal having a relatively uniform density of signal components. However, when the density of the signal components is not uniform, or when the density is very high, the integrated signal level cannot follow the desired base line level because the integrated level is greatly influenced by the signal components.

In detail, when the density of signal components is high, the integrated signal level rises accordingly so that the reference level rises, approaching the level of the input signal. Furthermore, if the density is not uniform, the reference level undesirably varies. As a result, the level of the input signal cannot be compared with a constant reference level. For instance, when the above-mentioned conventional technique is adopted to a signal processing circuit for a facsimile transmitter, waveform shaping of its scanner output signal sometimes results in occurrence of undesirable errors or distortion.

SUMMARY OF THE INVENTION

The present invention has been developed in order to remove the above-mentioned disadvantages and drawbacks inherent in the conventional method and circuit arrangement.

It is, therefore, a primary object of the present invention to provide a method and circuit arrangement for shaping a signal waveform in which the base line level of an input signal can be maintained constant without being influenced by the signal level.

Another object of the present invention is to provide a method and circuit arrangement for shaping a signal waveform by which a stable output signal can be obtained.

In accordance with the present invention an input signal is applied to a clamping circuit in which the level of the input signal is clamped at a desired base line voltage when a clamping control signal in the form of a pulse is applied thereto. On the other hand, the level of the output signal of the clamping circuit is detected to see whether the output level is below a reference voltage which is higher than the base line voltage. Periodic timing pulses, which will be used as the above-mentioned clamping control signal are generated and the timing pulses are fed to the clamping circuit as the clamping pulses only when the level of the output signal of the clamping circuit is between the reference voltage and the base line voltage. Therefore, the signal level is intermittently clamped at the base line voltage as long as the level of the output signal of the clamping circuit is below the reference voltage. On the contrary, if the signal level rapidly rises beyond the reference level within an interval of the timing pulses, clamping does not take place so that the output signal level follows the input signal level. The method of waveform shaping briefly described in the above is suitable for shaping a two-level signal, and when intended to shape a three-level signal, additional reference voltage which is lower than the base line voltage may be used to detect whether the level of the output signal of the clamping circuit is between the two reference voltages. Thus, clamping is performed only when the output signal level is between these two reference voltages.

BRIEF DESCRIPTION OF THE DRAWINGS

These and other objects and features of the present invention will be more readily apparent from the following detailed description of the preferred embodiments taken in conjunction with the accompanying drawings in which.

DETAILED DESCRIPTION OF THE PREFERRED EMBODIMENTS

Prior to describing the principle and the preferred embodiments of the present invention, a conventional technique will be described for a better understanding of the objects and features of the present invention.

Figure 1:
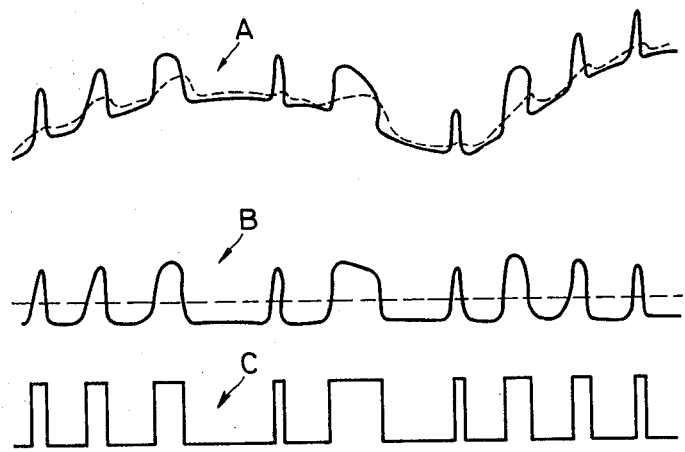
FIG. 1 shows waveforms of a signal showing the shaping process according to the present invention.
Figure 2:
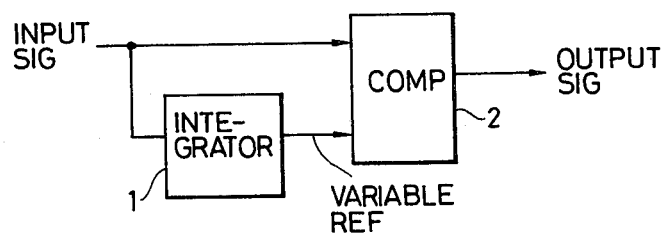
FIG. 2 is a schematic block diagram of a conventional circuit arrangement for shaping a waveform.

FIG. 2 illustrates a typical conventional waveform shaping circuit having an integrator 1 and a comparator 2. It is assumed than an input signal having a waveform "A" shown in FIG. 1 is applied to the conventional waveform shaping circuit. The input signal is applied to an input terminal of the integrator 1 so that the level of the input signal is integrated to produce an output signal having a waveform shown by a dotted curve along the waveform "A" in FIG. 1. The output signal of the integrator 1 is applied to the comparator as a reference signal to be compared with the level of the input signal. As a result, the comparator 2 produces an output signal in the form of logic "1" when the level of the input signal exceeds the reference signal level. The waveform of the input signal is originally of a square wave as shown by a waveform "C" in FIG. 1, and therefore, it is desirable to produce an output signal having a waveform as close to the waveform "C" as possible. However, as described in the above, since the reference level varies with time, the waveform shaping does not result in an accurate restoration.

Hence, the principle of the present invention will be described for a better understanding of the preferred embodiments of the present invention. In accordance with the present invention the waveform of an input signal, whose waveform is designated at a reference "A" in FIG. 1, is processed in such a manner that the base line of the input signal waveform becomes constant as shown by a waveform "B" in FIG. 1. After a constant base line is obtained, the level of the input signal is compared with a reference level indicated by a dotted line along the waveform "B". Namely, since the base line level is constant, the level of the input signal can be compared with a fixed reference voltage to produce a square wave output signal having a waveform very similar to the original waveform "C".

Figure 3:
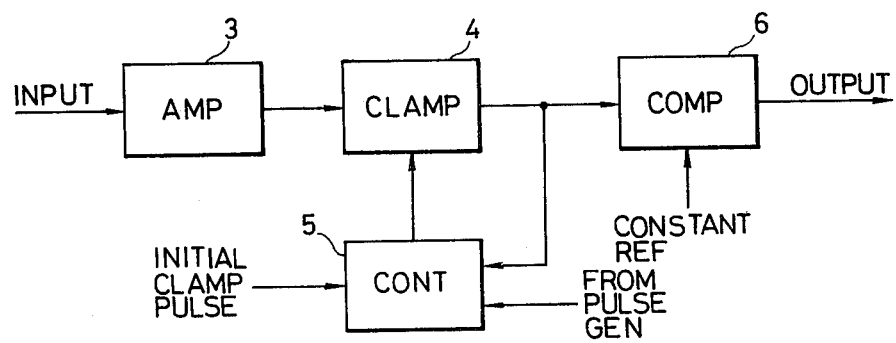
FIG. 3 is a schematic block diagram showing the method of shaping a signal waveform according to the present invention.

Reference is now made to FIG. 3 which shows a schematic block diagram useful for understanding the principle of the method of waveform shaping according to the present invention. In FIG. 3, a reference numeral 3 designates an amplifier for amplifying an input signal level to a necessary level. This amplifier 3 may be omitted if the input signal level is sufficiently high. An output terminal of the amplifier 3 is connected to an input of a clamping circuit 4 which clamps the level of the input signal when a clamping-control signal is applied thereto.

The clamping-control signal is produced in a clamp-control circuit 5 which is responsive to the output signal of the clamping circuit 4 and to a pulse train signal which is referred to as timing pulses. The clamp-control circuit 5 detects whether the level of the output signal of the clamping circuit 4 is close to the base line level or not so that the clamping-control signal is produced only when the level of the ouput signal is within a given range each time a pulse of the pulse train signal is applied to the clamp-control circuit 5.

The output signal of the clamping circuit 4 is further supplied to a comparator 6 in which the level of the signal is compared with a predetermined constant reference voltage. The output signal of the clamping circuit 4 corresponds to the waveform "B" of FIG. 1, while the straight dotted line shown along the waveform "B" corresponds to the constant reference voltage. As a result of the comparison, the comparator 6 produces a square wave or bistable output signal having the waveform "C" shown in FIG. 1.

Figures 4A, 4B:
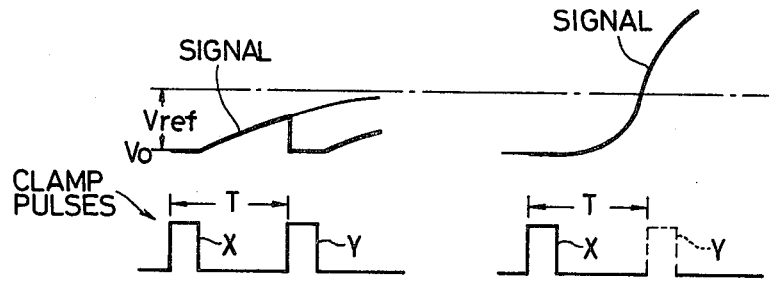
FIG. 4A and FIG. 4B are waveform charts useful for understanding the principle of the method of shaping a signal waveform according to the present invention.

The operation of the clamping circuit 4 and the clamp-control circuit 5 will be further described with reference to FIGS. 4A and 4B and FIG. 5. FIGS. 4A and 4B show the operation of the clamp-control circuit 5, and in each of FIGS. 4A and 4B, an upper waveform shows the output signal of the clamping circuit 4, while the lower waveform shows the clamping-control signal in the form of pulses. Since the clamping-control signal takes a form of pulses, this signal may also be referred to as a clamping-control pulse signal or simply as (a) clamping pulse(s). The clamping pulses are designated at references X and Y, and have a predetermined period. Namely, the clamping pulses X, Y ... are applied to the clamping circuit 4 at a regular interval T when clamping is necessary. It is assumed that the level of the output signal of the clamping circuit 4 equals the base line level, which is designated at a reference $V_0$, at the time corresponding to the leading edge of the first clamping pulse X. Therefore, the level of the input signal is clamped at the base line level or voltage $V_0$ for an interval defined by the width of the clamping pulse X even through the actual level of the input signal tends to deviate from the base line voltage $V_0$. After the signal level has been clamped for the interval defined by the clamp pulse width, namely, in the presence of the trailing edge of the clamping pulse X, clamping operation terminates. Therefore, the signal level rises gradually following the input signal level. However, the rising rate or speed is so low that the signal level does not exceed a reference level or voltage $V_{ref}$, which is higher than the base line level or voltage $V_0$, during the pulse interval T. Namely, the second clamping pulse Y is applied to the clamping circuit 4 before the signal level exceeds the reference level $V_{ref}$. As a result, the signal level is again clamped at the base line voltage $V_0$ in the same manner as mentioned in the above.

On the contrary, if the signal level rapidly rises during a pulse interval T to exceed the reference level $V_{ref}$ before the second pulse Y is produced, the clamping pulse Y is cancelled or erased. As a result, no clamping pulse is applied to the clamping circuit 4 so that the signal level is not clamped. From the above, it will be understood that the signal level is clamped if the rate of the signal level variation in the direction that the level deviates from the base line voltage $V_0$, during the interval T is lower than a given value, and on the other hand, the signal level is not clamped if the same direction variation rate is higher than the given value.

Figure 5:
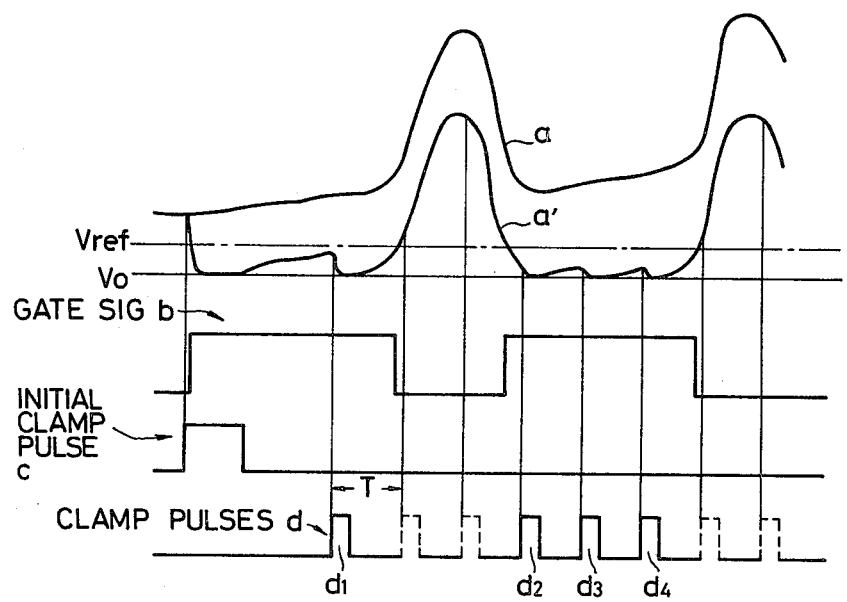
FIG. 5 is a waveform chart useful for understanding the operation of waveform shaping in case the principle of the present invention is adapted to shape a two-level signal.

The above-mentioned method of clamping is consecutively applied to obtain an output signal shown by a wide solid curve a' in FIG. 5. In FIG. 5, the waveform of an input signal is shown by a narrow solid curve a, and the method of clamping according to the present invention is described in detail with reference to FIG. 5. Let us assume that an input signal having a waveform indicated by the narrow solid curve a is applied to the clamping circuit 4 of FIG. 3. As shown, the lowest level of the input signal is higher than the reference level $V_{ref}$. The level of the input signal is forcibly clamped at the base line level $V_0$ by an initial clamping pulse c which functions as a reset pulse. Namely, the signal level exponentially falls as soon as the initial clamping pulse c is applied to the clamping circuit 4, and is maintained as long as the initial clamping pulse 4 continues (see curve a'). The width of the initial clamping pulse c is selected so that the level of the input signal is securely clamped at the base line voltage $V_0$. A gate signal b is produced in such a manner that the gate signal b assumes a high level when the level of the output signal of the clamping circuit 4 is between the base line voltage $V_0$ and the reference voltage $V_{ref}$. A series of clamping pulses d is applied to the clamping circuit 4 when a given period of time has passed after appplication of the initial clamping pulse c. Each of the clamping pulses d is applied to the clamping circuit 4 only when the gate signal b assumes its high level, i.e. logic "1" level. Therefore, clamping pulses are not applied when the gate signal b assumes its low level, i.e. logic "0" level even though the timing pulses are applied to the clamp-control circuit 5. In other words, the timing pulses are erased or rejected when the signal level exceeds the reference level $V_{ref}$ as indicated by dotted lines in FIG. 5 so that no clamping pulses are applied to the clamping circuit 4.

As mentioned in the above, the level of the output signal of the clamping circuit 4 drops when the initial clamping pulse c is applied to be clamped at the base line voltage $V_0$. As a result the above-mentioned gate signal assumes b its high level as long as the level of the output signal of the clamping circuit 4 is below the reference level $V_{ref}$. A first clamping pulse d1 is applied from the clamp-control circuit 5 to the clamping circuit 4 before the signal level exceeds the reference level $V_{ref}$. Therefore, the signal level which has been gradually varying is again clamped at the base line voltage $V_0$ in response to the first clamping pulse d1. It is to be noted that the first clamping pulse d1 is applied because the gate signal b assumes logic "1" at this time. After the first clamping pulse d1, the signal level rises again, and it is assumed that the signal level exceeds the reference voltage $V_{ref}$ before the end of the pulse interval T. The gate signal assumes logic "0" after the interval T so that the signal level is not clamped any more. The signal level keeps rising to reach its peak, and then starts to fall. As soon as the signal level drops below the reference voltage $V_{ref}$, the gate signal b turns to logic "1". Therefore, clamping pulses d2, d3 and d3 are consecutively applied at an interval to clamp the signal level at the base line voltage $V_0$ as long as the gate signal b assumes logic "1". Since the above-mentioned clamping operations are intermittently performed one after another, the signal level is equal to or very close to the base line voltage $V_0$ during an interval for which the gate signal b assumes logic "1".

The above-mentioned principle of the method of clamping according to the present invention will be better understood from the following description of the preferred embodiments.

Figure 6:
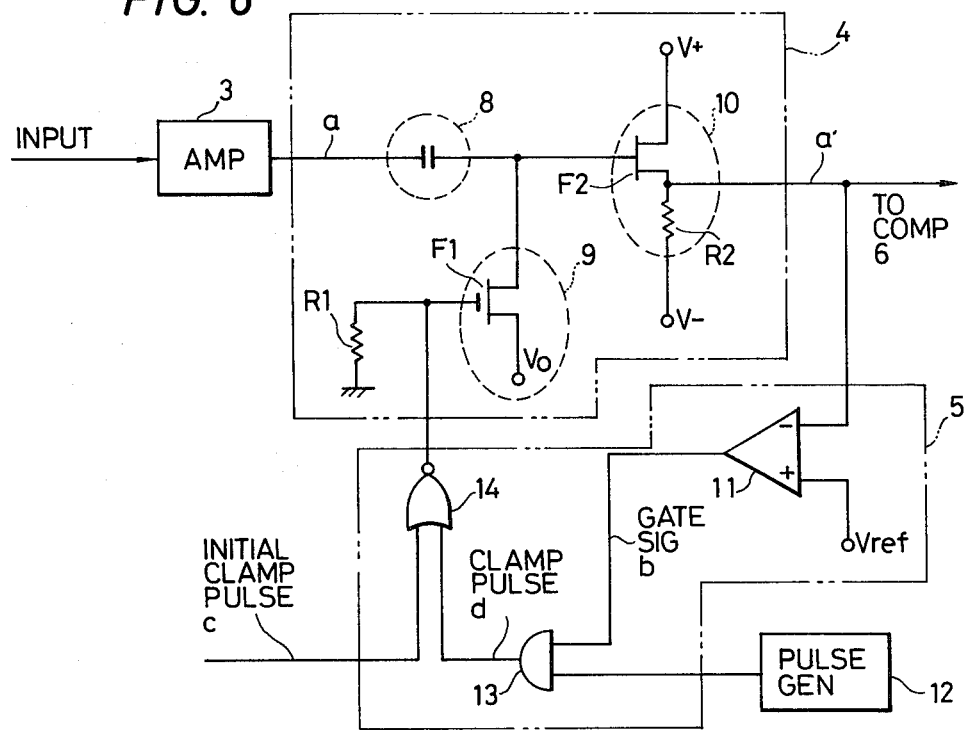
FIG. 6 is a circuit diagram of an embodiment of the circuit arrangement according to the present invention, which embodiment is for two-level waveform shaping.

Hence, reference is now made to FIG. 6 which is a schematic circuit diagram of a first embodiment. Circuits corresponding to those in FIG. 3 are designated at like numerals. The amplifier 3, which amplifies an input signal, may be omitted if the input signal level is sufficiently great as described hereinabove. The output terminal of the amplifier is connected to an input terminal of the clamping circuit having a capacitor 8, an analog switch 9, an impedance converter 10, and a resistor R1. The analog switch 9 comprises an FET (field effect transistor) F1, while the impedance converter 10 comprises an FET F2 and a resistor R2. In detail, the output terminal of the amplifier 3 is connected via the capacitor 8 to a gate of the FET F2 of the impedance converter 10, and to a drain of the FET F1 of the analog switch 9. A drain of the impedance converter 10 is connected to a positive terminal V+ of a power supply (not shown), while a source of the same is connected via a resistor R2 to the negative terminal V− of the power supply. The source of the FET F1 of the analog switch 9 is supplied with the above-mentioned base line voltage $V_0$ which may be set to a desired voltage by a suitable potentiometer (not shown). If the base line voltage $V_0$ is selected to correspond to the ground voltage, the source of the FET F1 may be connected to ground. The gate of the FET F1 is connected via the resistor R1 to ground, and is further connected to the output terminal of the clamp-control circuit 5 for receiving the above-mentioned clamping control signal, i.e. the clamping pulses. Although the resistor R1 is grounded as described in the above, a suitable voltage may be applied to the resistor instead of connecting to ground depending on the value of the base line voltage $V_0$.

The clamp-control circuit 5 comprises an operational amplifier 11, which functions as a comparator, an AND gate 13, and a NOR gate 14. The operational amplifier 11 has an inverting input (−) connected to the source of the FET F2 of the impedance converter 10, and a non-inverting input (+) for receiving the reference voltage $V_{ref}$, which may be set to a desired value by means of a suitable potentiometer (not shown). An output terminal of the operational amplifier 11 is connected to a first input terminal of the AND gate 13. The AND gate 13 has a second input terminal connected to a pulse generator or oscillator 12 for receiving the aforementioned series of timing pulses. An output terminal of the AND gate 13 is connected to a first input terminal of the NOR gate 14 having a second input terminal for receiving the initial pulse. An output terminal of the NOR gate 14 corresponds to the above-mentioned output terminal of the clamp-control circuit 5, and therefore, the NOR gate 14 output is connected to the gate of the FET F1 of the analog switch 9. The source of the FET F2 of the impedance converter 10 is further connected to the input of the comparator 6 shown in FIG. 3.

The circuitry of FIG. 6 operates as follows: Namely, the analog switch 9 becomes conductive when the voltage at the gate of the FET F1 is low. This means that the analog switch 9 becomes conductive only when either the initial clamping pulse c or a clamping pulse d of FIG. 5 is applied to the NOR gate 14. When the analog switch 9 is conductive, a given amount of charge, which is determined by the input signal voltage and the base line voltage $V_0$, is stored in the capacitor 8. On the contrary, when the voltage at the gate of the FET F1 becomes high, the analog switch 9 exhibits a high impedance. Since the input impedance of the impedance converter 10 is high, electrical current through the capacitor 8 is prevented from flowing. Accordingly, the charge stored in the capacitor is maintained as is. The level of the input signal is superimposed on the charge stored in the capacitor 8, and therefore, the superimposed signal level is impedance converted by the impedance converter 10 to be applied to the operational amplifier 11.

The operational amplifier 11 performs comparison by producing a high level output signal corresponding to a logic "1" signal when the reference voltage $V_{ref}$ is greater than the voltage of the output signal of the impedance converter 10. The output signal of the operational amplifier 11 corresponds to the above-mentioned gate signal b (see FIG. 5). The AND gate 13 permits the transmission of the pulses from the pulse generator 12 only when the gate signal b from the operational amplifier 11 assumes logic "1". In order to distinguish the input and output pulses of the AND gate 13, the pulses from the pulse generator 12 are referred to as timing pulses, while the output pulses of the AND gate 13 are referred to as clamping pulses as mentioned hereinabove. The capacitance of the capacitor 8, the frequency and duty cycle of the timing pulse train signal from the pulse generator 12 may be suitably selected in accordance with the waveform of the input signal.

When the waveform shaping method according to the present invention is adapted to a facsimile signal detector, an output signal having a stable two-level waveform is readily obtained without performing fine adjustment of the facsimile scanner, light source position, the sensor position or the like.

Although the above-described embodiment of FIG. 6 is directed to a circuit for shaping a signal originally having two values or levels into a bistable signal, a method of waveform shaping, in which the center level in a three-level signal is clamped at a desired center level, will be described with reference to another embodiment.

Figure 7A:
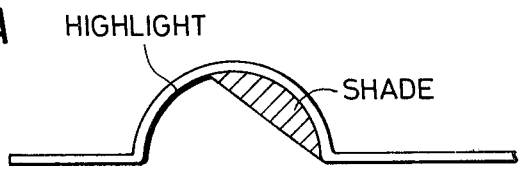
FIGS. 7A and 7B are explanatory views showing the manner of producing a three-level signal.
Figure 7B:
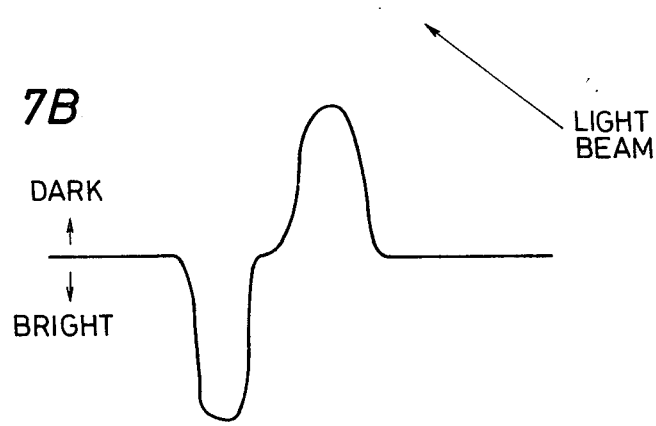
Figure 8:
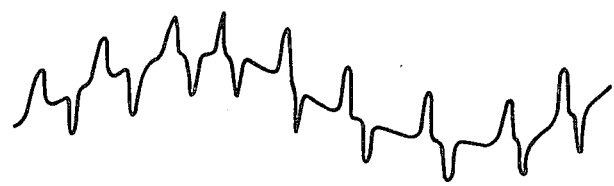
FIG. 8 is a waveform chart showing an example of a three-level signal.

FIGS. 7A and 7B illustrate a method of converting three-dimensional information such as Braille points into light and shade information. As shown in FIG. 7A, when a light beam is applied to a three-demensional portion on a flat plate, such as a sheet of paper, a shade is made in a portion where the light beam is blocked. On the other hand, a portion, where the light beam is substantially perpendicular thereto, turns to a highlight. Suppose that the brightness is detected by means of a photo sensor which scans along the surface of the flat plate including three-dimensional portions. The output signal of the photo sensor will take a waveform shown in FIG. 7B. Namely, the output signal assumes three levels, i.e. a high level corresponding to the dark portion, a low level corresponding to the highlight portion, and a base line level corresponding to the flat portion. Generally speaking, when a three-dimensional pattern or figure is detected by means of a scanning device, the base line level of the output signal of the scanning device fluctuates as shown in FIG. 8.

Figure 9:
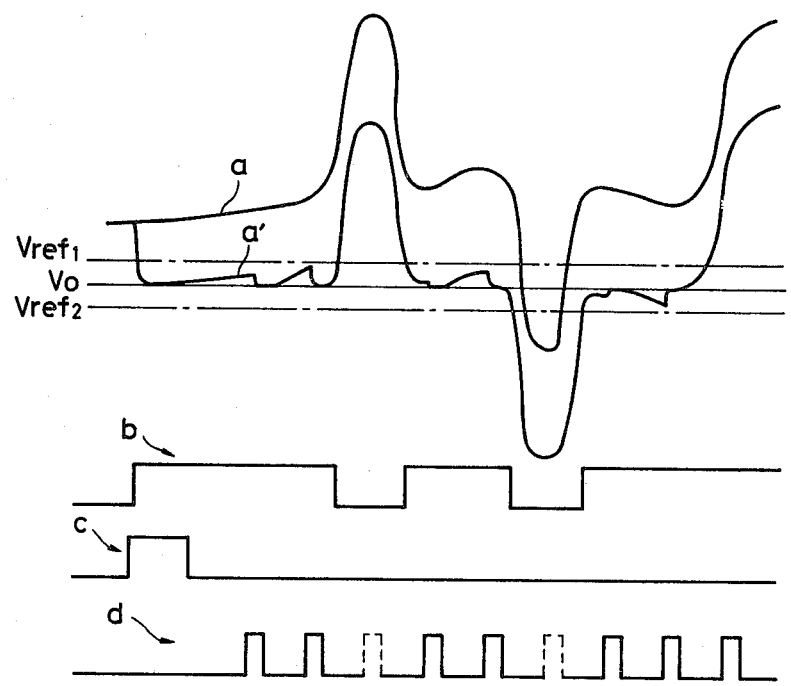
FIG. 9 is a wave form chart useful for understanding the operation of waveform shaping in case the principle of the present invention is adapted to shape a three-level signal.

FIG. 9 illustrates a method of clamping the center voltage of a three-level signal at a desired constant base line voltage $V_0$. In FIG. 9, a narrow solid curve a indicates the waveform of an input signal, and a wide solid curve a' indicates the waveform of an output signal of a clamping circuit of a shaping circuit according to the present invention. A gate signal, an initial clamping pulse, and a series of clamping pulses are respectively designated at references b, c and d in the same manner as in FIG. 5. The method of shaping three-level signal differs from the method of two-level signal in that two reference voltages $V_{ref1}$ and $V_{ref2}$ are used for respectively detecting the positive and negative values with respect to the base line voltage. Namely, the output signal level of the clamping circuit is detected by a window comparator so that the gate signal b assumes logic "1" level when the signal level represented by the output signal of a clamping circuit is between the two reference voltages $V_{ref1}$ and $V_{ref2}$. As shown in FIG. 9, the first reference voltage $V_{ref1}$ is higher than the base line voltage $V_0$, and the second reference voltage $V_{ref2}$ is lower than the base line voltage $V_0$. The clamping pulses d are used to clamp the signal level only when the gate signal b assumes logic "1". As a result, when the signal level has been rapidly risen or lowered, clamping is not performed because clamping pulses are not applied to the clamping circuit (see dotted line of the clamping pulses d in FIG. 9).

Figure 10:
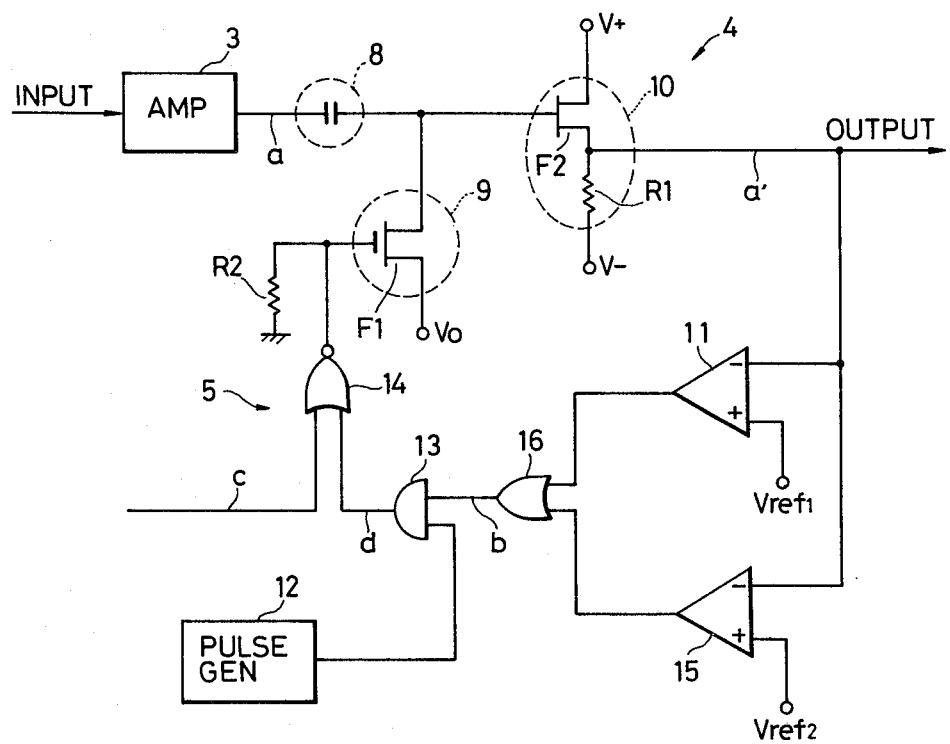
FIG. 10 is a schematic circuit diagram of a second embodiment of the circuit arrangement according to the present invention, which second embodiment is for three-level waveform shaping.

FIG. 10 shows a circuit diagram of an embodiment of a waveform shaping circuit in which shaping of a three-level signal is performed in accordance with the above-described method. Elements and circuits which are also used in the circuitry of FIG. 6, are designated at like numerals. The circuit arrangement of FIG. 10 differs from that of FIG. 6 in that there are two operational amplifiers 11 and 15 which function as comparators, and in that on OR gate 16 is additionally provided. Namely, the source of the FET F2 of the impedance converter 10 is connected to an inverting input terminl (−) of the operational amplifier 11 and to a noninverting input terminal (+) of the other operational amplifier 15, where the above-mentioned first and second reference voltage $V_{ref1}$ and $V_{ref2}$ are respectively applied to the remaining input terminals (+) and (−) of the operational amplifiers 11 and 15. The output terminals of these operational amplifiers 11 and 15 are respectively connected to input terminals of the OR gate 16, and then the output terminal of the OR gate 16 is connected to the first input terminal of the AND gate 13. Remaining structure of the circuit of FIG. 10 is the same as that of FIG. 6 and thus the description thereof is omitted. Since the OR gate 16 is responsive to the output signals of the operational amplifiers 11 and 15, the output signal of the OR gate 16 assumes logic "1" only when the level of the output signal of the clamping circuit 4 is between the reference voltages $V_{ref1}$ and $V_{ref2}$. Other operation of the circuit of FIG. 10 is the same as in the circuit of FIG. 6.

By using the circuit of FIG. 10 for reading Braille points, Braille points are accurately detected without any difficulty even though the light beam is not equally distributed to the surface of an objective sheet of paper or the sheet is irregularly curved. In addition, a stable output signal can be obtained with a simple scanning device.

From the foregoing description, it will be understood that the lowest or base line level or voltage of an input signal can be maintained at a desired constant voltage without being influenced by the variation of the signal level. Namely, when an input signal has an undesirable low frequency component, such a low frequency component is effectively removed from the signal and thus the base line level of the signal does not fluctuate after the method of waveform shaping according to the present invention is adopted.

The above-described embodiments are just examples, and therefore, it will be understood for those skilled in the art that many modifications and variations may be made without departing from the spirit of the present invention.

What is claimed is:

1. A method of shaping a signal waveform by means of a clamping circuit, comprising the steps of:
    (a) detecting the level of the output signal of said clamping circuit, to which said signal waveform is applied, to see whether said level is within a predetermined range or not;
    (b) clamping the level of said signal for a predetermined period of time when said level of said output signal is within said predetermined range; and (c) repeating said step of clamping at an interval which is longer than said predetermined period of time.

2. A method of shaping a signal waveform as claimed in claim 1, wherein said step of repeating is controlled by a periodic pulse train signal having a constant period.

3. A circuit arrangement for shaping a signal waveform comprising:
 (a) a clamping circuit for clamping the level of an input signal at a base line voltage in response to a clamping-control signal;
 (b) a pulse generator for generating a periodic pulse train signal;
 (c) a comparator for producing an output signal when the output signal level of said clamping circuit is below a reference level which is higher than said base line voltage; and
 (d) a gate circuit for supplying said clamping circuit with said clamping-control signal when said output signal of said comparator and a pulse of said pulse train signal are simultaneously applied thereto.

4. A circuit arrangement as claimed in claim 3, wherein said gate circuit comprises an AND circuit.

5. A circuit arrangement for shaping a signal waveform comprising;
 (a) a clamping circuit for clamping the level of an input signal at a base line voltage in response to a clamping-control signal;
 (b) a pulse generator for generating a periodic pulse train signal;
 (c) a first comparator for producing an output signal when the output signal level of said clamping circuit is below a first reference voltage which is higher than said base line voltage;
 (d) a second comparator for producing an output signal when the output signal level of said clamping circuit is above a second reference voltage which is lower than said base line voltage;
 (e) a first gate circuit for producing an output signal when said output signals of said first and second comparators are simultaneously applied thereto;
 (f) a second gate circuit for supplying said clamping circuit with said clamping-control signal when said output signal of said first gate circuit and a pulse of said pulse train signal are simultaneously applied thereto.

6. A circuit arrangement as claimed in claim 3 or 5, further comprising means for supplying an initial clamp pulse to said clamping circuit.

7. A circuit arrangement as claimed in claim 6, wherein said means comprises an initial clamp pulse generating circuit, and a third gate circuit for supplying said clamping circuit with said initial clamp pulse and the output signal of said second gate circuit as said clamping-control signal.

8. A circuit arrangement as claimed in claim 3 or 5, further comprising a comparator responsive to the output signal of said clamping circuit, and to a reference signal for producing a bistable signal.

9. A circuit arrangement as claimed in claim 3 or 5, further comprising an amplifier for amplifying said input signal prior to feeding said input signal to said clamping circuit.

* * * * *